(12) United States Patent
Rijnberg et al.

(10) Patent No.: US 7,224,747 B2
(45) Date of Patent: May 29, 2007

(54) GENERATING COEFFICIENTS FOR A PREDICTION FILTER IN AN ENCODER

(75) Inventors: Adriaan Johannes Rijnberg, Eindhoven (NL); Rakesh Taori, Eindhoven (NL); Alphons Maria Lambertus Bruekers, Eindhoven (NL)

(73) Assignee: Koninklijke Philips Electronics N. V., Eindhoven (NL)

( * ) Notice: Subject to any disclaimer, the term of this patent is extended or adjusted under 35 U.S.C. 154(b) by 927 days.

(21) Appl. No.: 09/755,365

(22) Filed: Jan. 5, 2001

(65) Prior Publication Data

US 2001/0033616 A1    Oct. 25, 2001

(30) Foreign Application Priority Data

Jan. 7, 2000    (EP) .................................. 00200055

(51) Int. Cl.
*H04K 1/02*    (2006.01)
*H04L 25/03*    (2006.01)
*H04L 25/49*    (2006.01)

(52) U.S. Cl. ........................ 375/296; 375/285; 375/229

(58) Field of Classification Search ................ 375/219, 375/254, 259, 285, 295, 296, 229, 232, 233; 708/300, 322, 323; 704/200, 201
See application file for complete search history.

(56) References Cited

U.S. PATENT DOCUMENTS

| | | | | |
|---|---|---|---|---|
| 3,502,986 A | * | 3/1970 | Lucky ........................ 375/244 |
| 4,075,655 A | * | 2/1978 | Iijima et al. .............. 348/394.1 |
| 4,719,649 A | * | 1/1988 | Woodsum et al. .............. 455/1 |
| 4,777,620 A | * | 10/1988 | Shimoni et al. ............ 382/233 |
| 5,293,448 A | * | 3/1994 | Honda ........................ 704/208 |
| 5,495,556 A | * | 2/1996 | Honda ........................ 704/265 |
| 5,809,460 A | * | 9/1998 | Hayata et al. .............. 704/225 |
| 5,890,126 A | * | 3/1999 | Lindemann .................. 704/503 |
| 5,892,694 A | * | 4/1999 | Ott .............................. 708/313 |
| 5,960,040 A | * | 9/1999 | Cai et al. ..................... 375/279 |
| 6,092,040 A | * | 7/2000 | Voran ......................... 704/228 |
| 6,184,756 B1 | * | 2/2001 | Tanaka et al. .............. 332/103 |
| 6,424,942 B1 | * | 7/2002 | Mustel et al. .............. 704/233 |
| 6,449,586 B1 | * | 9/2002 | Hoshuyama ................. 702/190 |
| 6,498,811 B1 | * | 12/2002 | Van Der Vleuten ........ 375/240 |

FOREIGN PATENT DOCUMENTS

| | | | | |
|---|---|---|---|---|
| JP | | 357079725 A | * | 5/1982 |
| JP | | 10083200 A | * | 3/1998 |

OTHER PUBLICATIONS

English Translation of JP10-083200A, Sep. 27, 2006.*
Derwent Acc-No. 1998-256707, Abstract of publication No. JP10083200A.*
"Lossless Coding for Audio Discs", by Croven et al, J. Audio Eng. Soc, vol. 44, No. 9, pp. 706-719, Sep. 1996.
F. Bruekers, "Improved Lossless Coding 1-bit Audio Signals", Presented at 103$^{rd}$ Convention of the AES, Sep. 26-29, 1997, reprinted 4563 (I-6).

* cited by examiner

Primary Examiner—Jean B. Corrielus

(57) ABSTRACT

A transmitter is disclosed for transmitting a transmission signal via a transmission medium. The transmitter derives a prediction signal from the digital information signal in dependence on an array of prediction filter coefficients. The array of prediction filter coefficients is obtained by smoothing a first array of coefficients. Said first array of coefficients is generated in response to the digital information signal. A residual signal is obtained by combination of the digital information signal and the prediction signal. The residual signal is encoded so as to obtain an encoded signal. The encoded signal is transmitted via the transmission medium.

8 Claims, 8 Drawing Sheets

GENERATING COEFFICIENTS FOR A PREDICTION FILTER IN AN ENCODER

Figure 1:
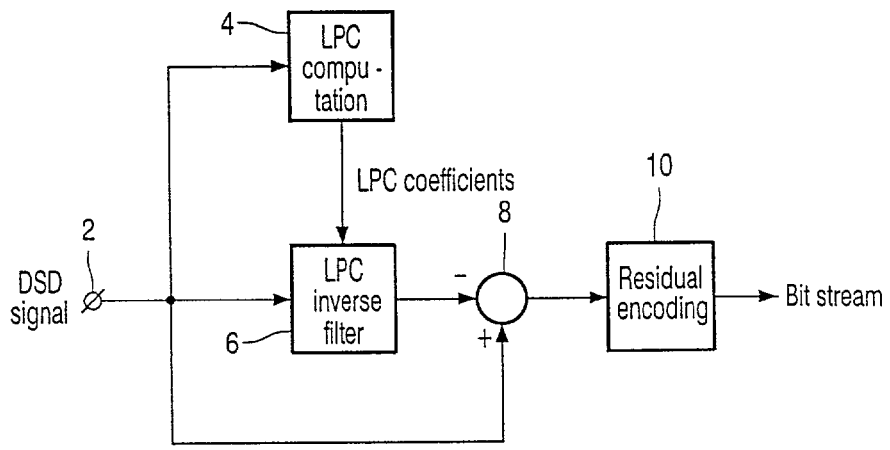

The invention relates to a transmitter for transmitting a digital information signal via a transmission medium, including:

input means for receiving the digital information signal, adaptive prediction filter means adapted to derive a prediction signal from the digital information signal in dependence on an array of prediction filter coefficients, first signal combination means for combining the digital information signal and said prediction signal so as to obtain a residual signal, encoding means for encoding said residual signal so as to obtain an encoded signal, coefficient generator means for generating an array of filter coefficients A[i] in response to the digital information signal, i being an integer for which it holds that $0 \leq i \leq p$, where p is a variable, output means for supplying the encoded signal to an output terminal for transmission via a transmission medium.

The invention further relates to a receiver for receiving a transmission signal and generating digital information therefrom, and to a transmission method.

A transmitting device and a receiving device of the type defined in the opening paragraph are known from J. Audio Eng. Soc., Vol. 44, No. 9, pp. 706–719, September 1996. The known transmitting device is intended to efficiently reduce the bit rate for the transmission of a digital information signal. Prior to encoding the digital information signal, a predicted version of the digital information signal is subtracted from the digital information signal. The residual signal thus obtained is successively encoded in the encoder and transmitted via the transmission medium. The performance of the linear prediction filter is crucial for the coding gain of the encoder. The performance of the linear prediction filter is determined by the prediction filter coefficient. A common method of finding the prediction coefficients (a-parameters) is the auto-correlation method. It appeared that a-parameters determined with the auto correlation method did not always result in the optimum coding gain.

It is an object of the invention to provide a transmitting device and a receiving device using a more efficient method of transmitting and receiving the digital information.

The transmitting device in accordance with the invention is characterized in that the device further comprises smoothing means for smoothing the array of filter coefficients A[i] so as to obtain the array of prediction filter coefficients for supply to the adaptive prediction filter means.

The receiver in accordance with the invention is characterized in that the receiver further comprises smoothing means for smoothing the array of filter coefficients A[i] so as to obtain the array of prediction filter coefficients for supply to the adaptive prediction filter means.

The invention is based on the following recognition. As long as transmission bandwidth and storage capacity is limited, there will be a need to increase the bit reduction of digital signals. It appeared that the acquired prediction filter coefficients (a-parameter) obtained by means of, for example, the auto-correlation method, did not result in an optimal coding gain. During extensive searches on the a-parameter values, it appeared that better coding gains could be achieved by slightly modified a-parameters. Coding gain improvements of about 4% could be achieved. However, the complexity needed in the transmitting device for such an extensive search would be enormous, and thus not practical.

Figure 8:
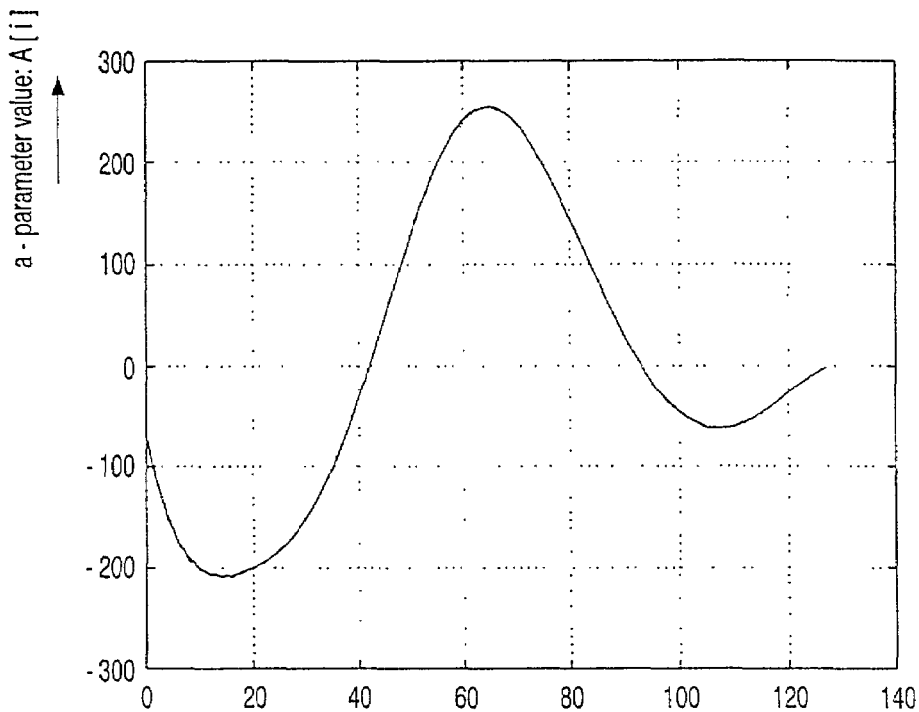

After investigation of the differences between the a-parameters before and after the extensive search, it appeared that the a-parameters are roughly the same (see FIG. 8). When zooming in at the first few a-parameters the a-parameters, obtained by means of the auto-correlation method show a rippling behavior while the a-parameters resulting from the extensive search are a smoothed version of it (see FIG. 9).

Figure 10:
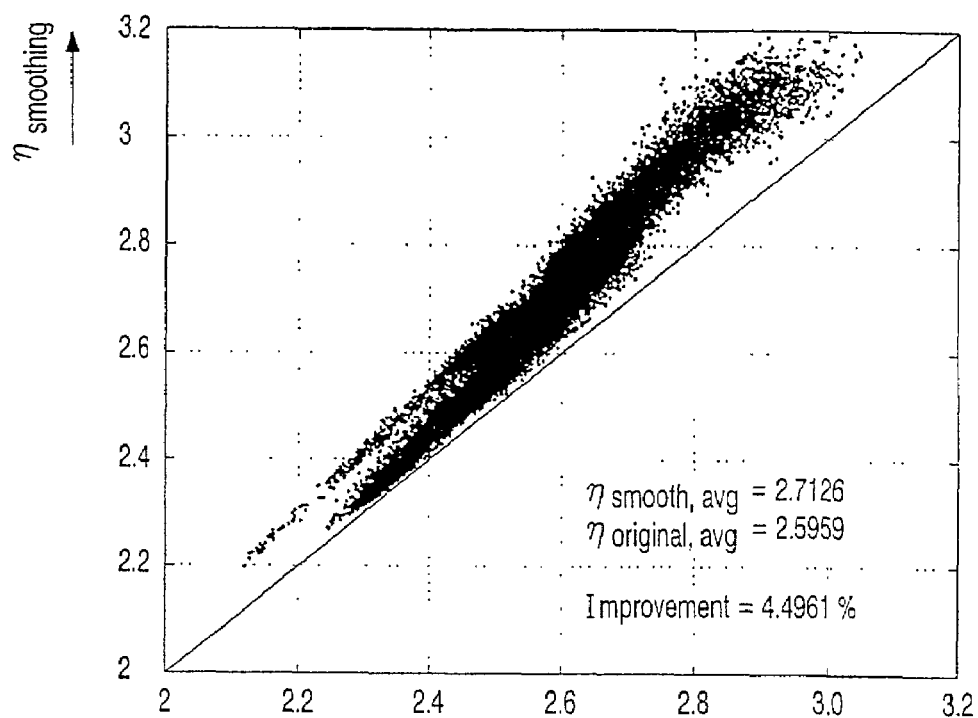
Figure 11:
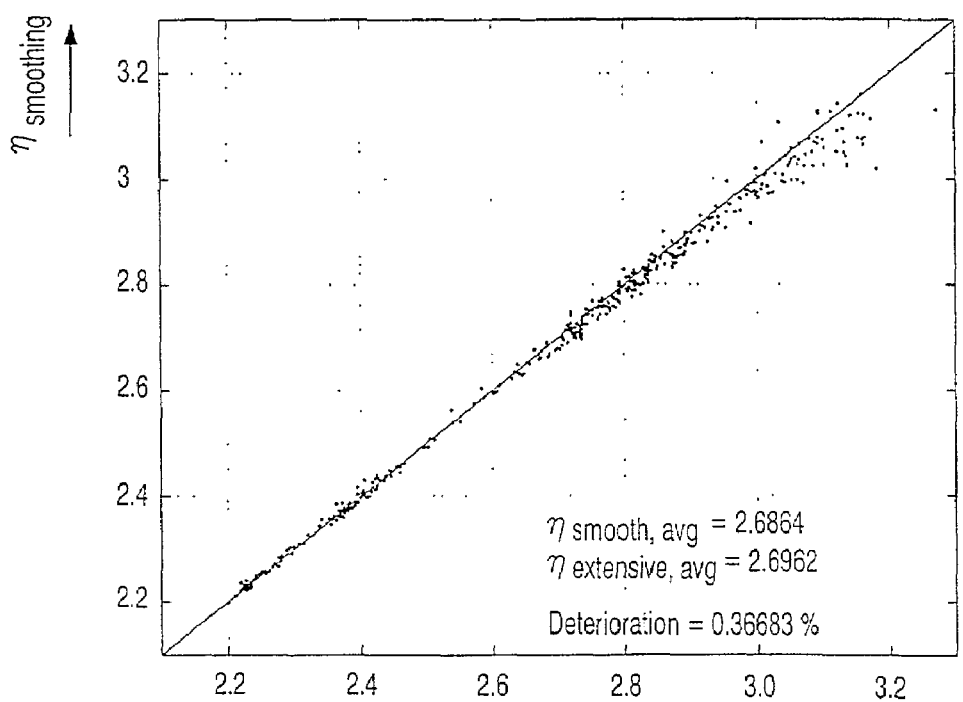

Instead of executing an extensive search on the a-parameters so as to obtain the prediction filter coefficients, the a-parameters acquired by means of the auto-correlation method are post-processed by way of a smoothing function. The improvement of the coding gain obtained with the smoothing function is comparable with the coding gain obtained with extensive search. FIG. 10 shows the results for a 5-minute DSD fragment, where the result was even an improvement of 4.5%. FIG. 11 shows that the performance is comparable in both methods (the extensive search would gain another 0.4% for this fragment). The increase of the complexity of the arrangement to implement the smoothing method is negligible as compared with the increase of the complexity of the arrangement when implementing the extensive search method.

Figure 2:
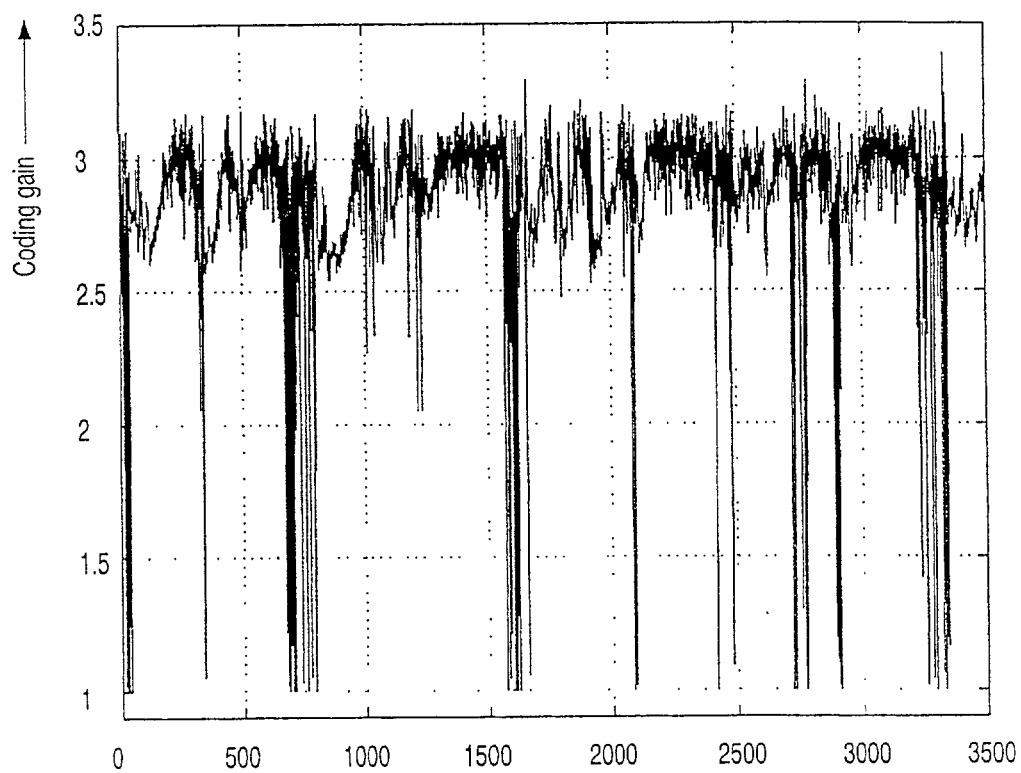
Figure 3:
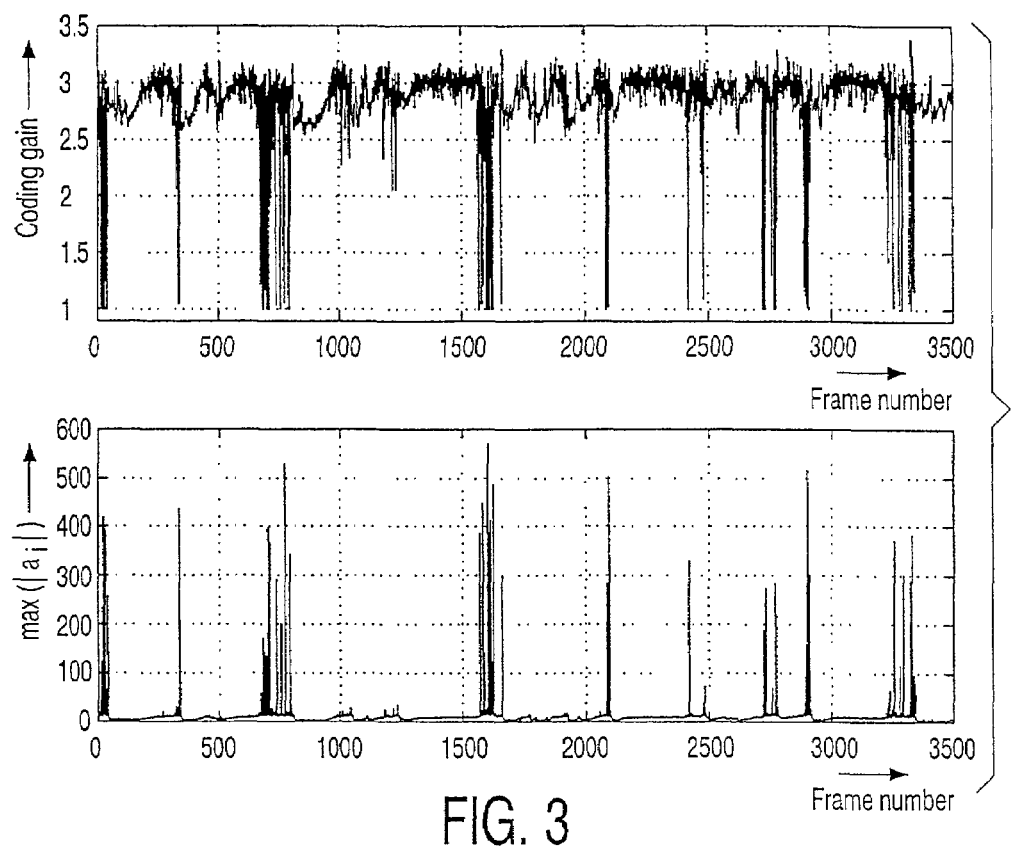
Figure 4:
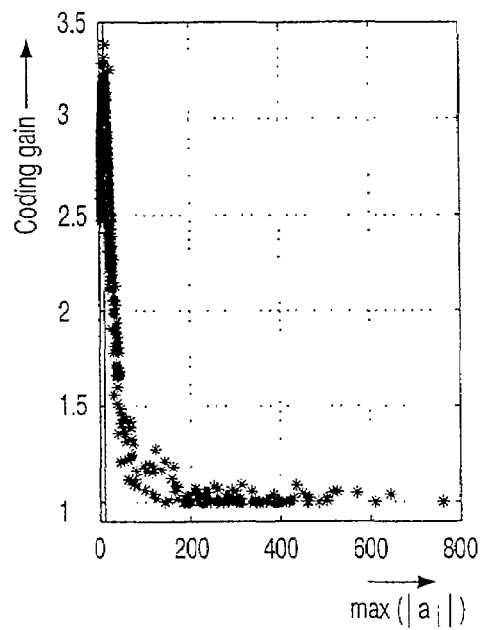
Figure 4A:
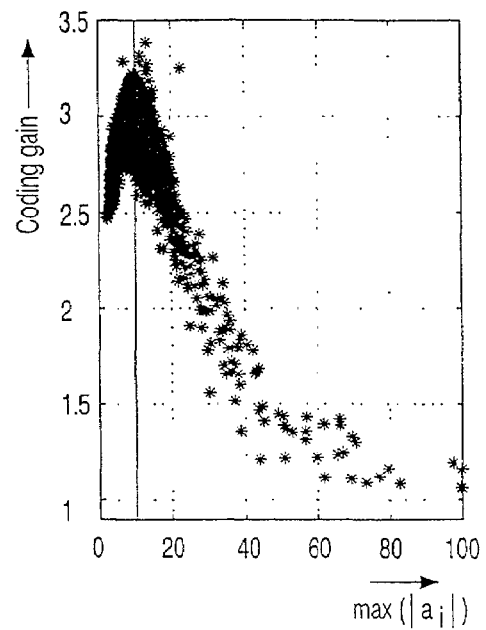
Figure 5:
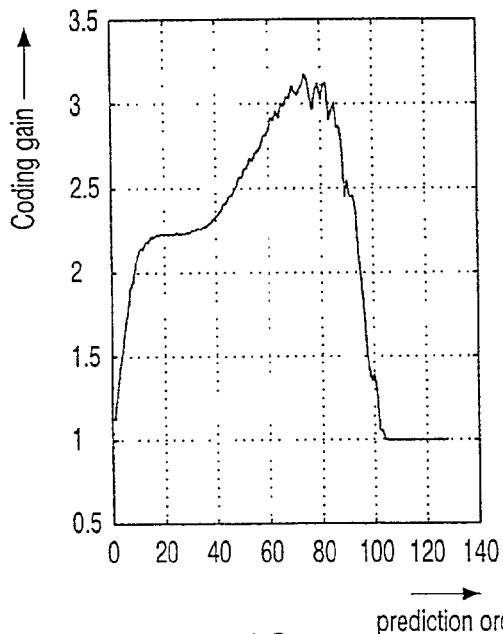
Figure 5A:
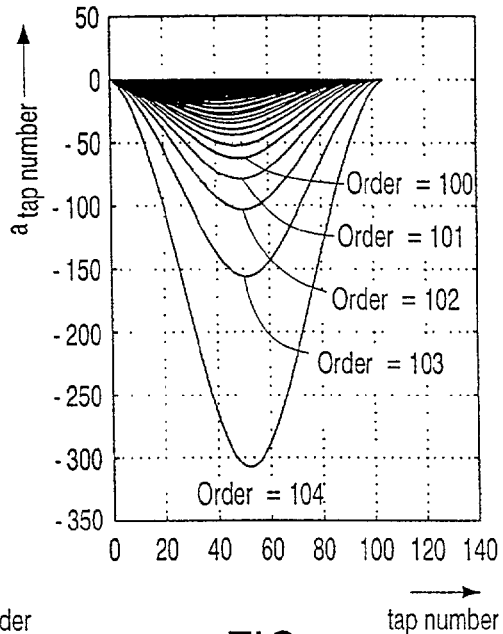
Figure 6:
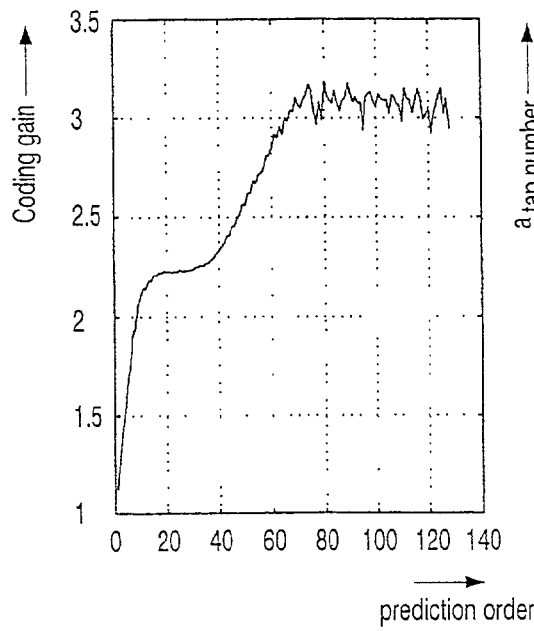
Figure 6A:
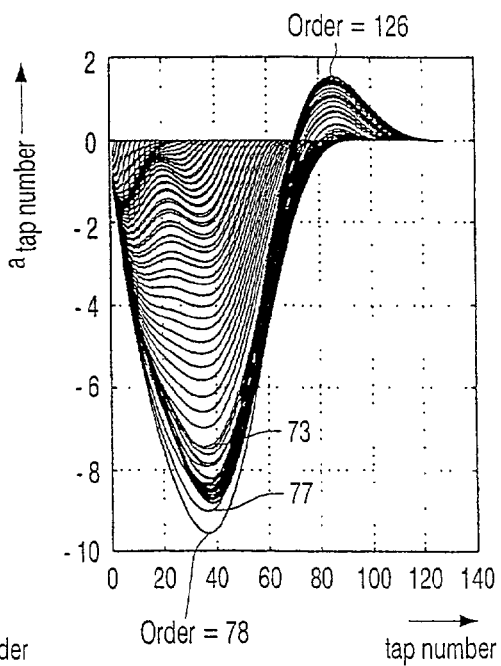
Figure 7:
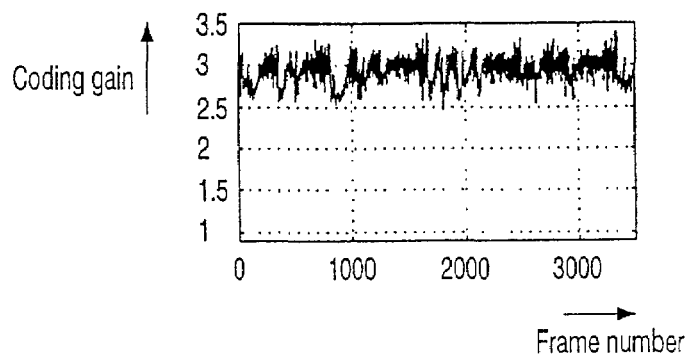
Figure 7A:
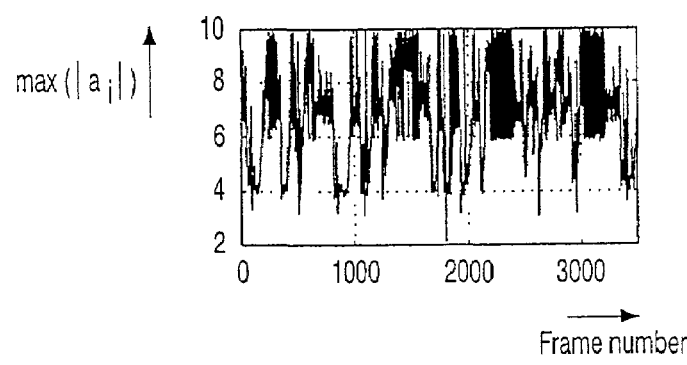
Figure 7B:
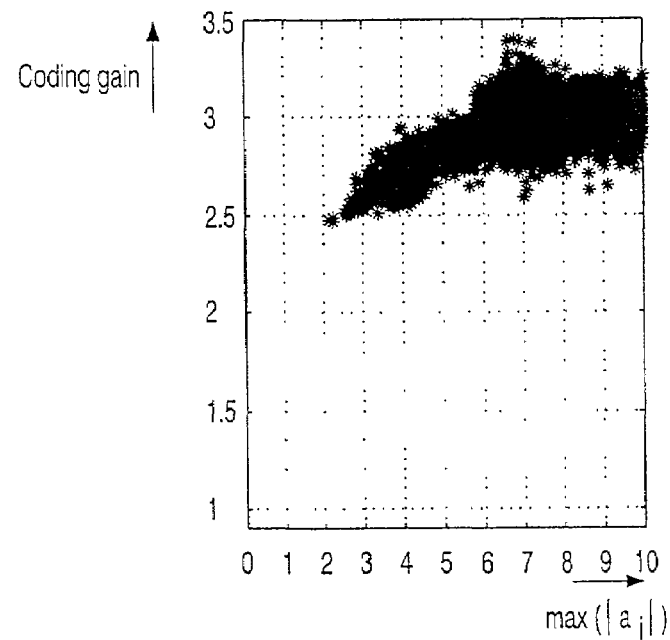
Figure 9:
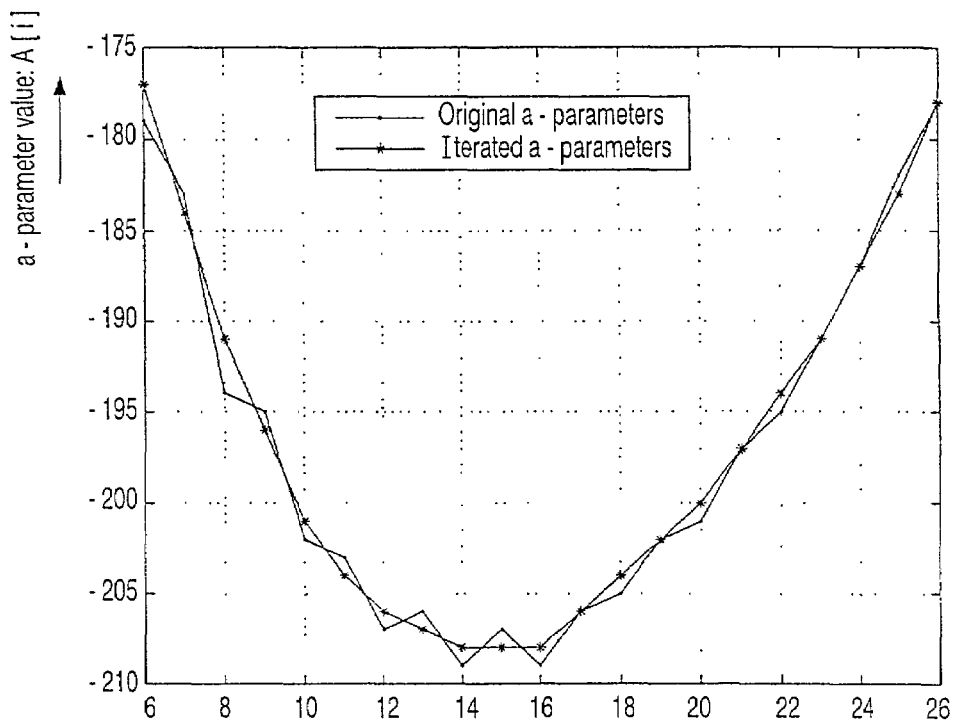
Figure 12:
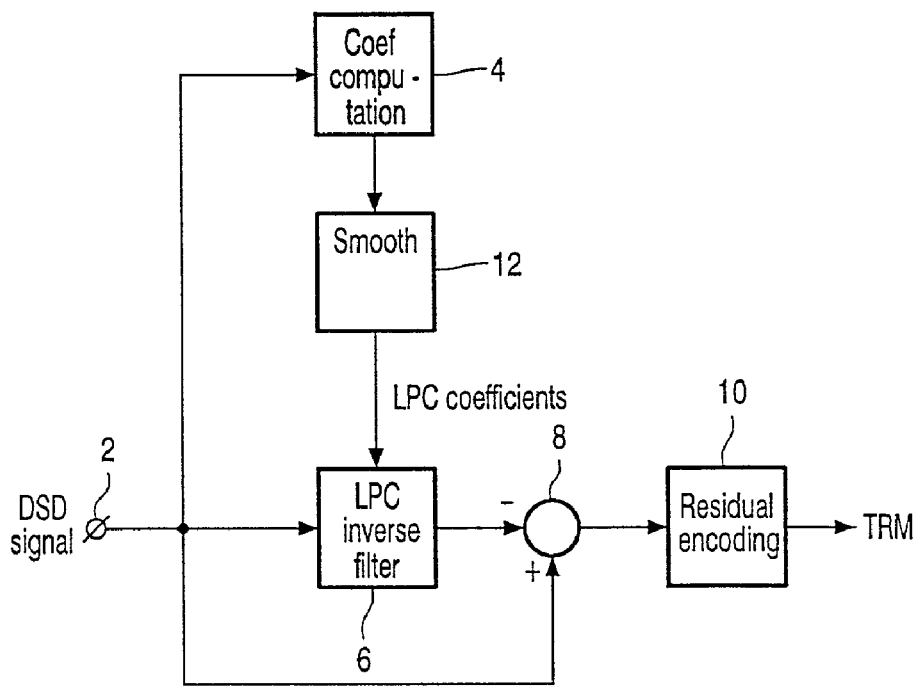
Figure 13:
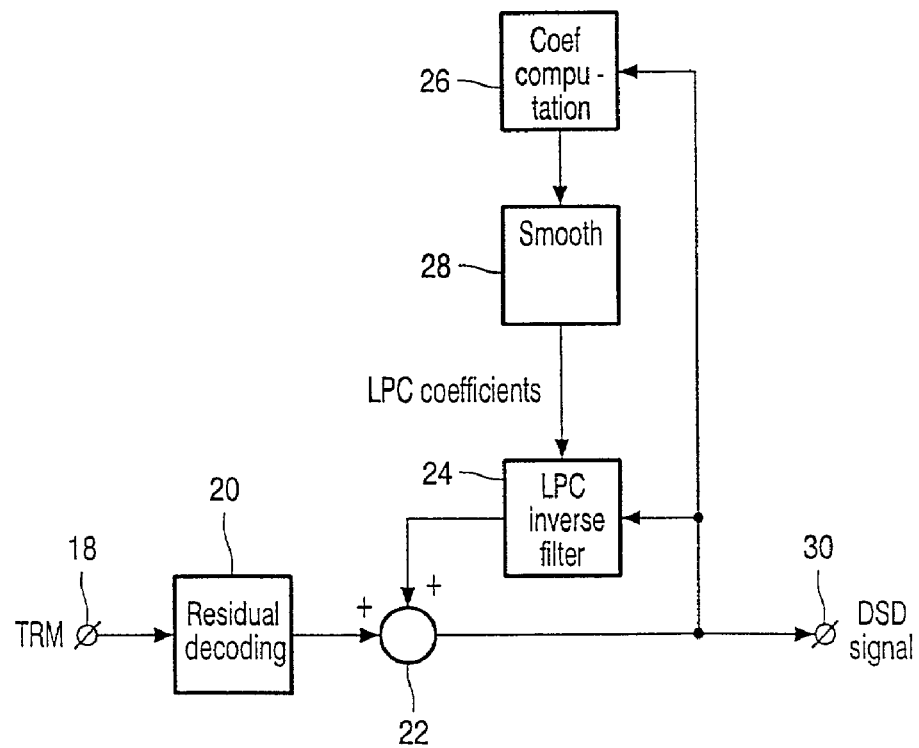
Figure 14:
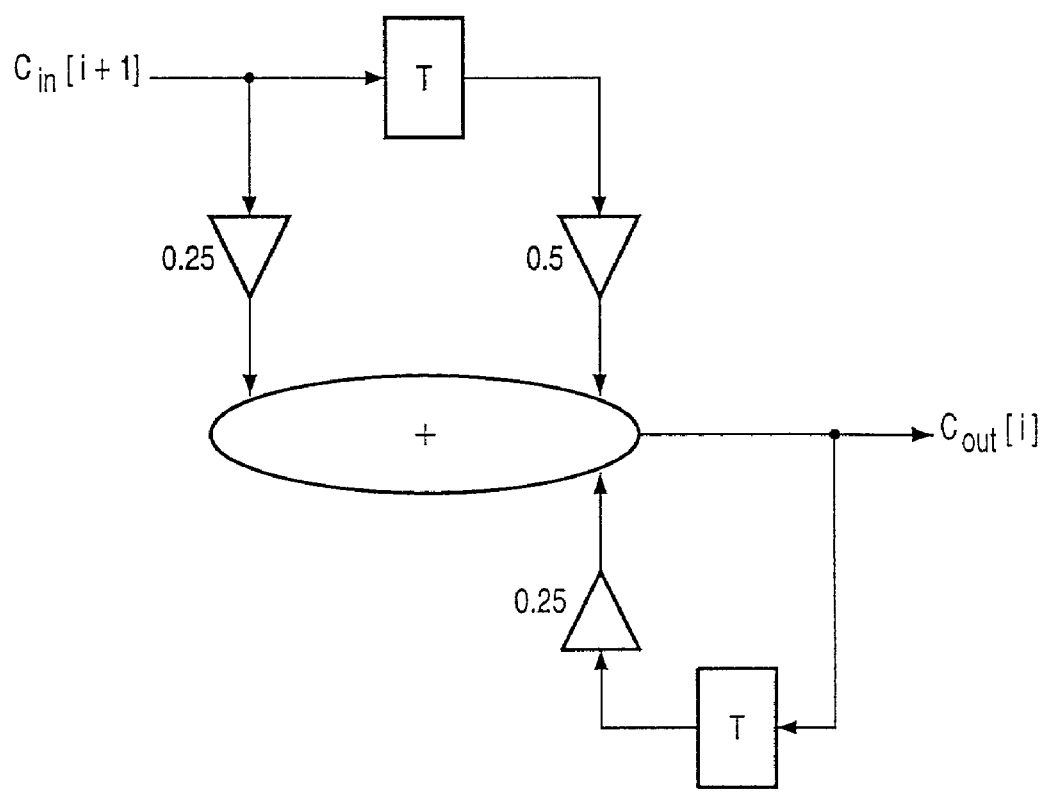

These and other aspects of the invention are apparent from and will be elucidated with reference to the embodiments described hereinafter. In the drawings, FIG. 1 shows an embodiment of an SACD encoder, FIG. 2 shows the coding gain of successive frames, FIG. 3 shows the coding gain of successive frames and the corresponding value of max $|a_i|$, FIG. 4 shows the coding gain as a function of max $|a_i|$, FIG. 4a shows a detailed view of the coding gain as a function of max $|a_i|$ shown in FIG. 4, FIGS. 5 and 5a show the coding gain and impulse response as a function of the prediction order, FIGS. 6 and 6a show the coding gain and impulse response as a function of the prediction order after applying the first two steps of the method according to the invention, FIG. 7 shows the coding gain of the same successive frames in FIG. 2 after applying the method according to the invention, FIG. 7a shows the value of max $|a_i|$ of successive frames after applying the method according to the invention, FIG. 7b shows the coding gain as a function of the max $|a_i|$ after applying the method according to the invention, FIG. 8 shows arrays of prediction filter coefficient before and after extensive search, FIG. 9 shows a detail of the arrays of prediction filter coefficients before and after the extensive search, FIG. 10 shows the coding gain obtained by using the first array of coefficients versus the coding gain obtained by using the smoothed version of the first array of coefficients, FIG. 11 shows the coding gain obtained by using the array of coefficients obtained by extensive search versus the coding gain obtained by using the smoothed version of the first array of coefficients, FIG. 12 shows an embodiment of a transmitter according to the invention, FIG. 13 shows an embodiment of a receiver according to the invention, and FIG. 14 shows a flow diagram of an embodiment of a smoothing algorithm.

For "Super Audio CD" (SACD), the audio signals are lossless coded, using framing, linear prediction and entropy coding. The coding gain η is heavily determined by the quality of prediction. It is therefore important to have an algorithm, which optimally determines the prediction coefficients. FIG. 1 shows a block diagram of a simplified scheme used in a SACD encoder. The DSD signal, which is a binary representation of an audio signal is received at the input terminal 2. The DSD signal is supplied to a coefficient generator unit 4 and an adaptive prediction filter 6. The coefficient generator unit 4 is arranged to derive coefficient for the adaptive filter such that the prediction filter generates a good prediction of the received DSD signal. A common method of finding the prediction coefficients is the auto-correlation method. The adaptive prediction filter 6 is arranged to generate a predicted DSD signal from the received DSD signal. The filter characteristic of the prediction filter depends on the supplied coefficients. Signal combination unit 8 subtracts the predicted DSD signal from the received DSD signal so as to obtain a residual signal. The residual signal is supplied to an encoding unit 10 so a to obtain an encoded signal. The encoded signal, which is a bit stream signal is supplied to a transmission medium. Depending on the implementation of the receiver the coefficients of the adaptive prediction filter have to be transmitted. The transmission medium could be a recording medium, such as an optical recording medium. The encoding unit comprises preferably a lossless encoder. Such an lossless encoder is described in F. Bruekers et al, "Improved lossless coding of 1-bit audio signals", presented at 103rd Convention of the AES, Sep., 26–29, 1997, preprint 4563(I-6). However other coder such as arithmetic coders, huffmann coder are suitable as well. The DSD signal is preferably divided into frames. Each frame is applied to the encoder resulting in an encoded signal and coefficients which are submitted to the transmission medium.

Disclosed is a low-complexity method of generating prediction coefficients which result in an improved coding gain.

The problem is that frames, for which high coding gain can be expected, often suffer from significantly low gains. Such a low coding gain on frames reduces the average coding gain and consequently has an adverse implication on the storage capacity. FIG. 2 shows the coding gain of successive frames illustrating the problem. In an excerpt, when the coding gain is relatively high (average 2.7), it can clearly be seen that there are frames with a very low coding gain (close to 1.0).

Interactively, selecting a lower prediction order would have prevented this problem. However, an important issue is that coding gain is only available once the entire coding process has taken place and the complexity of interactively/iteratively re-encoding the frame using lower order is high.

A detection mechanism is disclosed, which is capable of signaling LPC coefficients rendering low coding gain, where higher gain was possible, prior to encoding of the entire frame. The detection is based on the dynamic range of the direct form prediction-filter coefficients, often referred to as a-parameters. Consider FIG. 3, where the top trace is the same as FIG. 2 and the lower trace shows the value of the maximum of the absolute values of the a-parameters. It is clear from this Figure that the occurrence of low coding gain has a correlation with the occurrence of high values of max $|a_i|$. Based on this detection, a 3-stage process is disclosed to eliminate this problem. The result is prediction coefficients offering higher performance of the encoding process.

FIG. 4 illustrates a slightly different version of FIG. 3. Here, the maximum of the absolute values of a-parameters, max $|a_i|$, is shown on the horizontal axis and the vertical axis shows the corresponding coding gain. The a-parameters are determined by using the auto-correlation method in combination with the Schur algorithm. A line is drawn at a value of 10. Note that for cases, where the maximum of the absolute value of a-parameters is higher than 80, there is not a single occurrence of a frame with high coding gain.

When zooming in to one of the "problem frames", i.e. a frame with low coding gain and looking at the prediction gain as a function of the prediction order, we see FIG. 5. FIGS. 5 and 5a highlight two issues. FIG. 5 shows the coding gain as a function of the prediction order. FIG. 5a shows the impulse response for various prediction orders. One may conclude from FIG. 5 that a higher coding gain was possible, for instance at prediction order 80, where the gain was maximum. The second issue is highlighted in FIG. 5a. The impulse response only changes in scale but not in shape. It is interesting to interpret this in the spectral domain, if one realizes that the prediction gain is proportional to the non-flatness in the spectrum [Flanagan paper]. Thus, all the flattening has already been achieved in lower order, and when the order is increased, only the scale changes while the spectral coloring (or the flattening in the inverse filtered domain) does not change. This points to some ill conditioning. Steps were taken to avoid this problem by inspecting the impulse response of the prediction filter, i.e. without having to go through the entire coding process.

There appeared to be a relation between low coding gains and the maximum absolute value of the a-parameters returned by the auto-correlation method. For frames with a good coding gain, the value of the maximum absolute a-parameters is always below 10, and problem frames show values of 100 or even 600.

The step 1 in the method in accordance with the invention is the detection of the problem frames, i.e., frames for which the coding gain is low, while a higher gain was possible. Accordingly, step 1 includes the computation of the a-parameters based on the autocorrelation method. Next, a value T, representing the absolute maximum value of $a_i$ is computed on the basis of the a-parameters, $A=\{a_1, a_2, \ldots, a_{128}\}$, such that, $T=\max |A|$. A frame is declared as a problem frame if T is larger than a predefined value, for example 10.0.

Step 2: Some of these problems are eliminated if one adds a very low-level random noise signal to the input prior to LPC analysis. Equivalently, the value of R[0], the first auto-correlation coefficient, can be raised by a very small amount. If the threshold of step 1 is exceeded, the auto-correlation function coefficient R[0] is modified in such a way $R'[0]=R[0]*(1.0+4.10^{-6})$, and the a-parameters are recalculated in accordance with the new value of R[0].

Although such a minor modification solves the problem in most cases, there were frames for which the problem persisted, or even got worse (in terms of coding gain).

Step 3: The maximum absolute value of the now acquired a-parameters is again a good detection mechanism to see if problems are to be expected. For these frames, where the addition of a little noise does not solve the problem, another measure must be taken and that is to take a reduced order for LPC prediction. It is difficult, however, to select the optimal prediction order. A threshold which seems to achieve good results is: New Order=min ((current order*8/9), 80) where the current order is the order of prediction with which the analysis has been done.

In practice it appeared that with the combination of these three steps (detection via max(abs(a-parameters)), noise addition, and order reduction), the coding gain improved considerably for problem frames. More importantly, the good frames were not affected adversely with this mechanism.

Results

FIG. 6 shows the improvements achieved after applying the first 2 steps of the procedure discussed above. This is in contrast to FIG. 5 where the coding gain dropped sharply beyond $80^{th}$-order prediction. Now the a-parameters also exhibit a reasonable behavior in terms of the amplitude dynamics. As indicated above, even after applying the 2 steps, some problem frames persist and the application of step 3 eliminates them as well.

Finally, FIGS. 7, 7a and 7b show clearly that the bad frames were completely eliminated.

A three-stage approach of eliminating the bad frames entirely has been described. This was achieved by conditioning the signal in such a way that prediction coefficients are obtained which result in an improved coding gain.

While only Schur recursion has been discussed, experiments show that identical problems exist when using the Cholesky decomposition. Also in this case, the disclosed solution helps to completely eliminate the ill-conditioned a-parameters.

"Smoothing" of the a-parameters or prediction filter coefficients could yield (about) the same results as the extensive search, through for a negligible complexity.

A smoothing algorithm uses the a-parameters for calculating a new set of aparameters. Possible implementations could be done by, for example, FIR or IIR-filtering. After some experiments, a variant of the IIR-method was selected: /*Apar[0]..Apar[po−1] contain the a-parameters of the filter with prediction order po */ for (i=1; i<po−1; i++) {Apar[i]= Apar[i−1]+2*Apar[i]+Apar[i+1]}

As can be seen from this formula, the algorithm is recursive because the value which is adapted is reused in the next calculation. It appeared that it had a better effect than the non-recursive approach.

On average, some 3% coding gain improvement can be reached when applying this smoothing to the a-parameters. FIG. 10 shows the results for a 5-minute DSD fragment, where the result was even an improvement of 4.5%. The complexity of this method is negligible. As can be seen from FIG. 10 there were no frames where smoothing decreased the coding gain. Comparable results were obtained for some other DSD-fragments, with the exception that the gain showed a minor decrease for a very few high gain frames ($\eta>3$).

A comparison is made between the coding gains resulting from the extensive search and those resulting from smoothing the a-parameters that resulted from the autocorrelation method. FIG. 11 shows that the performance is comparable in both methods (the extensive search would gain another 0.4% for this fragment). To decrease the complexity of the arrangement, it is obvious that the method using smoothing of the a-parameters is preferred.

FIG. 14 shows a block diagram of another embodiment of the smoothing algorithm. The smoothing algorithm generates n coefficients for the prediction filter having n coefficients. $C_{in}[0:n-1]$ are the n filter coefficients before smoothing. $C_{out}[0:n-1]$ are the filter coefficients after smoothing. The following algorithm obtains the smoothed coefficients:

$$C_{out}[0]=C_{in}[0],$$

$$C_{out}[n-1]=C_{in}[n-1],$$

$$C_{out}[i]=0.25*C_{in}[i+1]+0.5*C_{in}[i]+0.25*C_{out}[i-1],$$

whereby I is an integer and $1 \leq i \leq n-2$.

FIG. 14 shows the block diagram representing the last expression. The square blocks represent a delay of one coefficient. The triangles represent the multiplication of the input signal with the corresponding factor. The ellipse represents the addition of all the inputted signals.

FIG. 12 shows an embodiment of an encoder in accordance to the invention. The encoder of FIG. 12 shows similarity with the encoder of FIG. 1. The units having the same reference number perform the same function. The encoder shown in FIG. 12 differs from the encoder shown in FIG. 1 in that the linear prediction coefficients are applied to a smoothing unit 12 prior to supplying the coefficients to the prediction filter 6. An embodiment of the smoothing function performed by the smoothing unit is described above. Preferably the smoothing unit performs a low-pass filtering on the coefficients. Such filters could be implemented by finite impulse response filters (FIR), infinite response filter (IIR) or a combination of FIR and IIR. FIG. 14 shows a combination of an IIR and a FIR filter.

FIG. 13 shows an embodiment of a receiver in accordance to the invention. A transmission signal comprising an encoded signal, is received at an input terminal 18. The received signal is supplied to a decoder unit 20. The decoder unit 20 decodes the encoded signal so as to obtain a residual signal. The decoder unit preferably comprises a lossless decoder. Such an lossless decoder is described in F. Bruekers et al, "Improved lossless coding of 1-bit audio signals", presented at 103rd Convention of the AES, Sep., 26–29, 1997, preprint 4563(I-6). However other coder such as arithmetic decoders, huffmann decoder are suitable as well. The residual signal is supplied to a signal combination unit 22. The signal combination unit is arranged to add a predicted digital information signal to the residual signal so as to obtain the digital information signal. The digital information signal is supplied to an output terminal of the receiver 30. The digital information signal is further supplied to a coefficient generator unit 26 and an adaptive prediction filter 24. The coefficient generator unit is arranged to derive filter coefficients for the adaptive prediction filter from the digital information signal. A common method of finding the prediction coefficients is the auto-correlation method. However others method are suitable as well. The prediction filter coefficients are supplied to a smoothing unit 28 adapted to perform a smoothing function on the prediction coefficients so as to obtain smoothed prediction filter coefficients. Preferably the smoothing unit performs a low-pass filtering. The smoothed prediction filter coefficients are supplied to the adaptive prediction filter 24. The adaptive prediction filter is adapted to generate the predicted digital information signal. It should be noted that for lossless transmission of the digital information signal the adaptive prediction filter, the coefficient generator unit and the smoothing unit in the transmitter and receiver perform exactly the same functions. It should further be noted that, the coefficient generator unit 26 and the smoothing unit 28 are optionally if the transmission signal comprises an encoded signal and the adaptive prediction filter coefficients. In said case the adaptive prediction filter coefficients need not to be derived by the receiver from the digital information signal.

The disclosed method is also lower in complexity when compared with the alternative that where entire coding process has to be performed before the coding gain is known.

Though the invention is described with reference to preferred embodiments thereof, it is to be understood that these are non-limitative examples. Thus, various modifications are conceivable to those skilled in the art, without departing from the scope of the invention, as defined by the claims.

The use of the verb "to comprise" and its conjugations does not exclude the presence of elements or steps other than those stated in a claim. Furthermore, the use of the article "a" or "an" preceding an element does not exclude the presence of a plurality of such elements. In the claims, any reference signs placed between parenthesis shall not be construed as limiting the scope of the claims. The invention may be implemented by means of hardware as well as software. Several "means" may be represented by the same item of hardware. Furthermore, the invention resides in each and every novel feature or combination of features.

The invention claimed is:

1. A transmitting device for transmitting a digital information signal via a transmission medium, said transmitting device comprising:
   input means for receiving the digital information signal;
   adaptive prediction filter means for deriving a prediction signal from the digital information signal in dependence on an array of prediction filter coefficients;
   first signal combination means for combining the digital information signal and said prediction signal so as to obtain a residual signal;
   encoding means for encoding said residual signal so as to obtain an encoded signal;
   coefficient generator means for generating an array of filter coefficients A[i] in response to the digital information signal, i being an integer for which it holds that $0 \leq i < p$, where p is a variable;
   output means for supplying the encoded signal to an output terminal for transmission via the transmission; and
   smoothing means for smoothing the array of filter coefficients A[i] so as to obtain the array of prediction filter coefficients for supply to the adaptive prediction filter means,
   wherein the smoothing means includes low-pass filtering means for low-pass filtering the array of filter coefficients so as to obtain the prediction filter coefficients, and
   wherein said low-pass filtering means performs the following equations to obtain the coefficients:

$Cout[0]=Cin[0]$, $Cout[i]=0.25*Cin[i+1]+0.5*Cin[i]+0.25*Cout[i-1]$, whereby i is an integer and $1 \leq i \leq n-2$, $Cout[n-1]=Cin[n-1]$, Cin[x] being coefficient number x before smoothing, and Cout[x] being coefficient number x after smoothing.

2. The transmitting device as claimed in claim 1, characterized in that the low-pass filtering means comprises an finite impulse response (FIR) filter.

3. The transmitting device as claimed claim 1, characterized in that the low-pass filtering means comprises an infinite impulse response (IIR) filter.

4. The transmitting device as claimed in any one of the preceding claims, wherein said transmitting device further comprise:
   an arrangement for writing the encoded signal on a record carrier.

5. A method of transmitting a digital information signal via a transmission medium, said method comprising the steps of:
   receiving the digital information signal;
   deriving a prediction signal from the digital information signal in dependence on an array of prediction filter coefficients;
   combining the digital information signal and said prediction signal so as to obtain a residual signal;
   encoding said residual signal so as to obtain an encoded signal;
   generating an array of filter coefficients A[i] in response to the digital information signal, i being an integer for which it holds that $0 \leq i < p$, where p is a variable;
   supplying the encoded signal to an output terminal for transmission via the transmission medium; and
   smoothing the array of filter coefficients A[i] so as to obtain the array of prediction filter coefficients, wherein;
   the smoothing includes low-pass filtering the array of filter coefficients A[i] so as to obtain the prediction filter coefficients;
   the low-pass filtering is selected between one of at least impulse response (FIR) filtering and infinite impulse response (IIR) filtering;
   the low pass filtering applies the following equations to obtain the prediction filter coefficients:

$Cout[0]=Cin[0]$;

$Cout[i]=0.25*Cin[i+1]+0.5*Cin[i]+0.25*Cout[i-1]$, whereby i is an integer and $1 \leq i \leq n-2$;
   $Cout[n-1]=Cin[n'1]$, Cin[x] being coefficient number x before smoothing, and Cout[x] being coefficient number x after smoothing;
   supplying the encoded signal includes writing the encoded signal on a record carrier.

6. A method of transmitting information via a transmission medium, said method comprising the steps of:
   receiving a digital information signal;
   generating a plurality of filter coefficients in response to the digital information signal;
   smoothing the filter coefficients to obtain a plurality of prediction filter coefficients;
   deriving a prediction signal from the digital information signal in dependence on the filter coefficients;
   combining the digital information signal and the prediction signal to obtain a residual signal;
   encoding said residual signal to obtain an encoded signal; and
   supplying the encoded signal to the transmission medium, wherein said smoothing step comprises low-pass filtering of the filter coefficients to obtain the prediction filter coefficients, and wherein the low pass filtering step performs the following equations to obtain the coefficients:

$Cout[0]=Cin[0]$;

$Cout[i]=0.25*Cin[i+1]+0.5*Cin[i]+0.25*Cout[i-1]$, whereby i is an integer and $1 \leq i \leq n-2$;
   $Cout[n-1]=Cin[n-1]$, Cin[x] being coefficient number x before smoothing, and Cout[x] being coefficient number x after smoothing.

7. The method as claimed in claim 6, wherein the low-pass filtering step comprises finite impulse response (FIR) filtering.

8. The method as claimed in claim 6, wherein the low-pass filtering step comprises infinite impulse response (IIR) filtering.

* * * * *